United States Patent [19]
Kayama

[11] Patent Number: 4,952,991
[45] Date of Patent: Aug. 28, 1990

[54] VERTICAL FIELD-EFFECT TRANSISTOR HAVING A HIGH BREAKDOWN VOLTAGE AND A SMALL ON-RESISTANCE

[75] Inventor: Chizuru Kayama, Tokyo, Japan

[73] Assignee: NEC Corporation, Tokyo, Japan

[21] Appl. No.: 397,232

[22] Filed: Aug. 23, 1989

[30] Foreign Application Priority Data

Aug. 25, 1988 [JP] Japan ................... 63-211858

[51] Int. Cl.$^5$ ........................................... H01L 29/78
[52] U.S. Cl. .................... 357/23.4; 357/86; 357/89
[58] Field of Search .................... 357/23.4, 86, 89

[56] References Cited

U.S. PATENT DOCUMENTS 4,593,302  6/1986  Lidow et al. .
4,884,113  11/1989  Muramoto .................. 357/23.4

FOREIGN PATENT DOCUMENTS 53-135284  11/1978  Japan .

Primary Examiner—Edward J. Wojciechowicz
Attorney, Agent, or Firm—Burns, Doane, Swecker & Mathis

[57] ABSTRACT

A vertical MOSFET includes a base region formed on the surface of a drain region, a source region provided in the base region, a first semiconductor region provided on the surface of the drain region between portions of the base region, the first semiconductor region having the same conductivity type as the drain region and an impurity concentration higher than that of the drain region, a second semiconductor region of the opposite conductivity type provided in the first semiconductor region, a gate electrode provided on the base region surrounded by the source region and the first semiconductor region, and an insulating film provided on the second semiconductor region.

4 Claims, 2 Drawing Sheets

FIG. 1
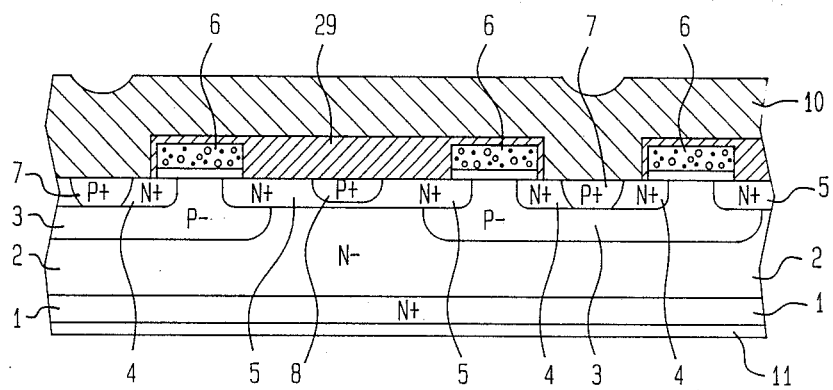
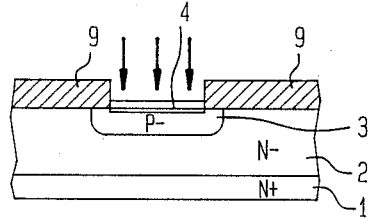
FIG. 2(a)
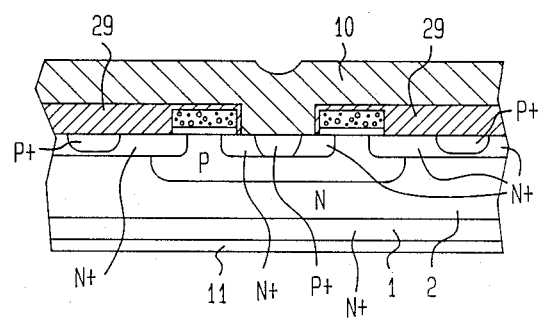
FIG. 2(d)
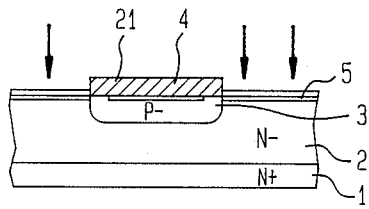
FIG. 2(b)
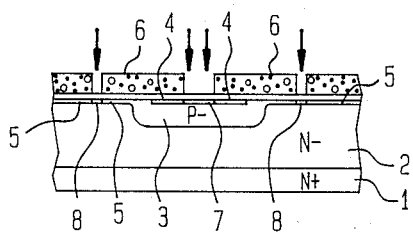
FIG. 2(c)

VERTICAL FIELD-EFFECT TRANSISTOR HAVING A HIGH BREAKDOWN VOLTAGE AND A SMALL ON-RESISTANCE

BACKGROUND OF THE INVENTION

1 Field of the Invention

The present invention relates to a field effect transistor, and more particularly, to improvements of breakdown voltage and on-resistance of a vertical field effect transistor.

2 Description of the Related Art

A conventional vertical field effect transistor is disclosed in Japanese Patent Laid-Open No. 53-135284 and U.S. Pat. No. 4,593,302 and has an n$^-$-type active layer on an n$^+$-type substrate serving as a drain, a p-type base region formed in a surface area of the n$^-$-type layer, an n$^+$-type source region formed in the p-type base region, a gate electrode positioned, through an insulating film, on the p-type base region between the n$^+$-type source region and the n$^-$-type layer to extend over the n$^-$-type layer, and an n$^+$-type layer formed in the surface area of the n$^-$-type layer adjacent to the p-type base region. In such vertical field effect transistor, the electrons flowing from the n$^+$-type source region to the n$^+$-type drain region flow through a channel region induced at a surface of the p-type base region under the gate electrode. In this electron flow-path, since the n$^+$-type layer is formed on the surface of the n$^-$-type layer adjacent to the p-type base region, the on-resistance of this field effect transistor decreases. With the n$^+$-type layer being provided on the surface of the n$^-$-type in contact with the p-type base region, however, the breakdown voltage between the drain region and the base region decreases.

SUMMARY OF THE INVENTION

It is, therefore, an object of the present invention to provide a vertical field effect transistor which is so constructed as to decrease the on-resistance without lowering the breakdown voltage.

The field effect transistor in accordance with the present invention includes a first semiconductor region formed on a main surface of a semiconductor substrate of one conductivity type except for a predetermined portion of the substrate, the first semiconductor region being of the other conductivity type, a second semiconductor region formed on the main surface of the semiconductor substrate uncovered by the first semiconductor region, the second semiconductor region having the one conductivity type with an impurity concentration higher than the semiconductor substrate and being in contact with first semiconductor region, a third semiconductor region of the other conductivity type formed in the second semiconductor region, a fourth semiconductor region formed on a surface of the first semiconductor region, the fourth semiconductor region being separated from the second semiconductor region and being of the one conductivity type, a gate electrode formed on the first semiconductor region between the second semiconductor region and the fourth semiconductor region, an insulating film provided on the second semiconductor region and on the third semiconductor region, a first electrode electrically connected to the fourth semiconductor region and a second electrode electrically connected to the other main surface of the semiconductor substrate.

Since the second semiconductor region having the same conductivity type as the semiconductor substrate is formed on the main surface of the semiconductor substrate to have an impurity concentration higher than that of the semiconductor substrate, the field effect transistor according to the present invention has a small on-resistance. Furthermore, since the third semiconductor region of the other conductivity type is formed in the second semiconductor region together with the insulating film covering the second and third semiconductor regions, the third semiconductor region is under the floating condition to act just like a field ring to relax the concentration of electric field, resulting in keeping a high breakdown voltage. According to the present invention, therefore, there is obtained a field effect transistor having a decreased on-resistance with high breakdown voltage.

The third semiconductor region is preferably shallower than the second semiconductor region, because, if the third semiconductor region becomes deeper than the second semiconductor region, the current path becomes narrow to increase the on-resistance.

BRIEF DESCRIPTION OF THE DRAWINGS

The above and further objects, features and advantages of the present invention will become more apparent from the following detailed description taken in conjunction with the accompanying drawings, wherein:

FIG. 1 is a sectional view illustrating one embodiment of the present invention;

FIGS. 2(a) to 2(d) are sectional views illustrating major steps for manufacturing the vertical field effect transistor of the one embodiment of the present invention.

DESCRIPTION OF THE PREFERRED EMBODIMENTS

Figure 3:
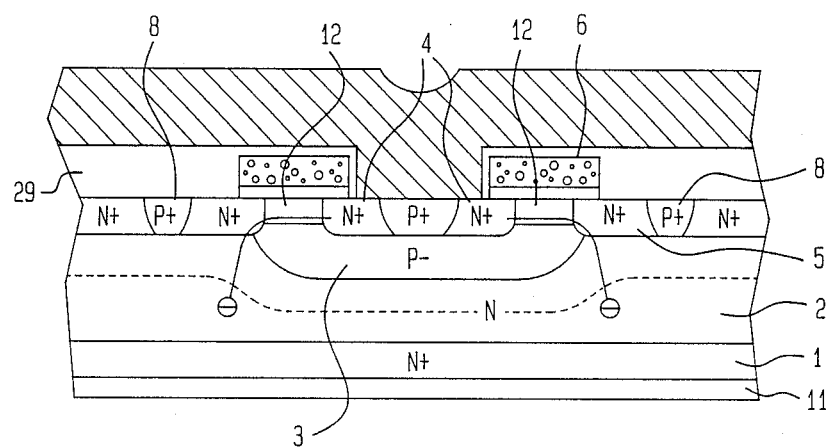
FIG. 3 is a sectional view illustrating the motion of electrons and the expansion of the depletion layer when the field effect transistor shown in FIG. 1 is in operation.

FIG. 1 is a sectional view of a preferred embodiment in which the present invention is adapted to an n-channel insulated-gate vertical field effect transistor. On an n$^+$-type Sb doped silicon substrate 1 having an impurity concentration of $3.0 \times 10^{18}$ atoms/cm$^3$, is formed an n$^-$-type epitaxially grown layer 2 having an impurity concentration of $6.4 \times 10^{14}$ atoms/cm$^3$ and a film thickness of 30 $\mu$m. A p$^-$-type base region 3 having a depth of 4 $\mu$m and an impurity concentration of $2.5 \times 10^{17}$ atoms/cm$^3$ is provided in the surface region of the n$^-$-type epitaxially grown layer 2. An n$^+$-*type source region* 4 *having a depth of* 1.0 $\mu$m and an impurity concentration of $2.0 \times 10^{20}$ atoms/ cm$^3$ is formed in a central surface portion of the p$^-$-type base region 3. At a central portion of the n$^+$-type source region 4, is provided a p$^+$-type region 7 having an impurity concentration of $2.0 \times 10^{18}$ atoms/cm$^3$ from the surface thereof to reach the p$^-$-type base region 3. At a surface portion of the n$^-$-type epitaxially grown layer 2 which is adjacent to the p$^-$-type base region 3, is provided an n$^+$-type region 5 having a depth of 2.0 $\mu$m and an impurity concentration of $1.0 \times 10^{15}$ atoms/cm$^3$, and, at the central portion of the n$^+$-type region 5, is provided a p$^+$-type region 8 having an impurity concentration of $2.0 \times 10^{18}$ atoms/cm$^3$ and a depth of 1.5 $\mu$m. A gate electrode 6 of polycrystalline silicon is formed on the p$^-$-type base region 3 between the n$^+$-type source region 4 and the n+-type region 5 through a gate insulating film. An oxide film 29 having a thickness of 6000 Å is formed on the n+-type region 5 and on the p+-type region 8 between the gate electrodes 6. A source electrode 10 is provided being commonly connected to the n+-type source region 4 and to the p+-type region 3, and a drain electrode 11 is provided on the back surface of the n+-type silicon substrate 1.

A method for manufacturing the vertical field effect transistor will now be described in conjunction with FIGS. 2(a) to 2(d).

As shown in FIG. 2(a), first, an n⁻-type epitaxial layer 2 is grown on the n-type semiconductor substrate 1, and p-type impurities are implanted by using an oxide film 9 as a mask to form a p⁻-type region 3. Next, using the same mask, n-type impurities are implanted at a high concentration in order to form an n+-type source region 4.

Next, as shown in FIG. 2(b), n-type impurities are implanted at a high concentration in the surface layer of the drain region 5 by using another oxide film 21 as a mask.

Referring to FIG. 2(c), p-type impurities are implanted at a high concentration using a polycrystalline silicon layer 6 as a mask in order to form p+-type layers 7 and 8.

Then, as shown in FIG. 2(d), ions are implanted and diffused to a suitable depth, followed by forming an oxide film 29 on the drain region, forming a source electrode 10 thereon, and forming a drain electrode 11 on the back surface of the substrate 1.

FIG. 3 shows a flow of electrons and the expansion of the depletion layer, when the insulated gate field effect transistor of this embodiment is in operation. Electrons flowing out from the n+-type source region 4 pass through the channel 12 and the surface layer of the drain region 5 to arrive at the drain electrode 11.

The drain region 5 is formed by implanting impurity ions at a high concentration after the p⁻-type region 3 has been formed. A relationship of dosage is p+-type layer 8 ($5 \times 10^{14}/cm^2$ to $5 \times 10^{16}/cm^2$) > drain region 5 ($2 \times 10^{11}/cm^2$ to $5 \times 10^{14}/cm^2$) > p⁻-type region 3. Due to the drive-in diffusion, therefore, the drain region 5 diffuses in the lateral direction toward the p⁻-type region 3 to shorten the channel 12. Moreover, since the surface of the drain region 5 has a high concentration, the on-resistance decreases.

The p+-type layer 8 in the drain region is under the floated condition, the depletion layer is expanded like the field ring, and concentration of electric field is relaxed under the gate electrode 6. Therefore, the breakdown voltage is prevented from decreasing.

Though the foregoing embodiment has dealt with the n-channel field effect transistor, the same effects are also obtained even with the p-channel field-effect transistor in which the types of conduction are reversed.

What is claimed is:

1. A field effect transistor comprising:

a first semiconductor region formed on a main surface of a semiconductor substrate of one conductivity type except for a predetermined portion of said semiconductor substrate, said first semiconductor region being of the other conductivity type;

a second semiconductor region formed on said main surface of said semiconductor substrate uncovered by said first semiconductor region, said second semiconductor region having said one conductivity type with an impurity concentration higher than said semiconductor substrate;

a third semiconductor region of the other conductivity type formed in said second semiconductor region;

a fourth semiconductor region formed on a surface of said first semiconductor region, said fourth semiconductor region being separated from said second semiconductor region and said fourth semiconductor region being of said one conductivity type;

a gate electrode formed on said first semiconductor region between said second semiconductor region and said fourth semiconductor region;

an insulating film provided on said second semiconductor region and on said third semiconductor region;

a first electrode electrically connected to the fourth semiconductor region; and a second electrode electrically connected to the other main surface of said semiconductor substrate.

2. A field effect transistor as claimed in claim 1, wherein said third semiconductor region is shallower than said second semiconductor region.

3. A vertical field effect transistor comprising:

a drain region of one conductivity type;

a base region of the other conductivity type provided on one main surface of said drain region;

a source region of said one conductivity type provided in said base region;

a first semiconductor region of said one conductivity type provided on said one main surface of said drain region between portions of said base region, said first semiconductor region having an impurity concentration higher than that of said drain region;

a second semiconductor region of the other conductivity type provided in said first semiconductor region;

a gate electrode provided on said base region between said source region and said first semiconductor region;

an insulating film provided on said second semiconductor region;

a source electrode electrically connected to said source region; and a drain electrode electrically connected to said drain region.

4. A vertical field effect transistor as claimed in claim 3, wherein said second semiconductor region is shallower than said first semiconductor region.

* * * * *